United States Patent [19]
Ning et al.

[11] Patent Number: 5,965,193
[45] Date of Patent: Oct. 12, 1999

[54] PROCESS FOR PREPARING A CERAMIC ELECTRONIC CIRCUIT BOARD AND PROCESS FOR PREPARING ALUMINUM OR ALUMINUM ALLOY BONDED CERAMIC MATERIAL

[75] Inventors: Xiao-Shan Ning, Nagano; Choju Nagata, Tokyo; Masami Sakuraba, Tokyo; Toshikazu Tanaka, Tokyo; Katsuaki Suganuma, Osaka; Masami Kimura, Tokyo, all of Japan

[73] Assignee: Dowa Mining Co., Ltd., Tokyo, Japan

[21] Appl. No.: 08/902,054

[22] Filed: Jul. 29, 1997

Related U.S. Application Data

[63] Continuation-in-part of application No. 08/736,276, Oct. 24, 1996, abandoned, which is a continuation-in-part of application No. 08/418,426, Apr. 7, 1995, abandoned, and a continuation-in-part of application No. 08/685,533, Jul. 24, 1996, abandoned, and a continuation-in-part of application No. 08/740,194, Oct. 24, 1996, abandoned.

[30] Foreign Application Priority Data

Apr. 11, 1994 [JP] Japan ..................... 6-096941

[51] Int. Cl.[6] ............... B05D 5/12; B05D 3/02; B05D 3/12
[52] U.S. Cl. .............. 427/126.4; 427/58; 427/357; 427/398.1; 427/431; 427/443.2
[58] Field of Search ................ 427/58, 96, 126.4, 427/320, 398.1, 357, 431, 432, 443.2

[56] References Cited

U.S. PATENT DOCUMENTS

| | | | |
|---|---|---|---|
| 3,994,430 | 11/1976 | Cusano et al. | 228/122 |
| 4,056,650 | 11/1977 | Dates et al. | 428/332 |
| 4,082,869 | 4/1978 | Raymond . | |
| 4,104,417 | 8/1978 | Sara . | |
| 4,129,243 | 12/1978 | Cusano . | |
| 4,693,409 | 9/1987 | Mizunoya et al. | 228/122 |
| 4,849,292 | 7/1989 | Mizunoya . | |
| 5,130,498 | 7/1992 | Yoshida . | |
| 5,213,877 | 5/1993 | Yoshida . | |
| 5,262,203 | 11/1993 | Lesher et al. | 427/383.5 |

FOREIGN PATENT DOCUMENTS

| | | |
|---|---|---|
| 0 351 203 | 1/1990 | European Pat. Off. . |
| 2109254 | 5/1972 | France . |
| 52-37914 | 3/1977 | Japan . |
| 55-87305 | 7/1980 | Japan . |
| 59-13563 | 1/1984 | Japan . |
| 59-121890 | 7/1984 | Japan . |
| 2-142195 | 5/1990 | Japan . |
| 3-93687 | 4/1991 | Japan . |
| 3-125463 | 5/1991 | Japan . |
| 4-12554 | 1/1992 | Japan . |
| 4-18746 | 1/1992 | Japan . |
| 4-24312 | 4/1992 | Japan . |
| 5-8013 | 1/1993 | Japan . |
| 5-77027 | 3/1993 | Japan . |
| 7-193358 | 7/1995 | Japan . |

OTHER PUBLICATIONS

Chemical Abstracts, vol. 111, No. 6, Aug. 7, 1989, Columbus, Ohio, US, Abstract No. 44255b, I. Okamoto, p. 312 of JP 01 09,884.

Chemical Abstracts, vol. 117, No. 6, Aug. 6, 1992, Columbus, Ohio, US, Abstract No. 54498w, H. Miyazaki, p. 371 of JP 04 75,758.

*Primary Examiner*—Shrive Beck
*Assistant Examiner*—Michael Barr
*Attorney, Agent, or Firm*—Frishauf, Holtz, Goodman, Langer & Chick, P.C.

[57] ABSTRACT

Molten aluminum and a ceramic substrate are held in direct contact with each other and thereafter cooled to have the aluminum joined directly to the ceramic substrate. This method is capable of consistent and easy production of aluminum-ceramics composite substrates having satisfactory joint strength, thermal conductivity and heat resistance characteristics. A ceramic member is fed successively into and through molten metal to directly bond the metal on the ceramic to produce a metal-bonded-ceramic (MBC) material at a low cost. An electronic circuit substrate made of an aluminum ceramic composite material wherein an electronic circuit is formed on an aluminum surface of the aluminum-ceramic composite material. The aluminum-ceramic composite material is made by directly solidifying molten aluminum or an aluminum alloy on at least a portion of a ceramic substrate.

22 Claims, 6 Drawing Sheets

PROCESS FOR PREPARING A CERAMIC ELECTRONIC CIRCUIT BOARD AND PROCESS FOR PREPARING ALUMINUM OR ALUMINUM ALLOY BONDED CERAMIC MATERIAL

CROSS REFERENCE TO RELATED APPLICATIONS

This application is a continuation-in-part application of (i) application Ser. No. 08/736,276, filed Oct. 24, 1996, which is a continuation-in-part application of application Ser. No. 08/418,426, filed Apr. 7, 1995 (abandoned); (ii) application Ser. No. 08/740,194, filed Oct. 24, 1996, (abandoned); and (iii) application Ser. No. 08/685,533, filed Jul. 24, 1996 (abandoned).

BACKGROUND OF THE INVENTION

1. Field of the Invention

This invention relates to a process for producing ceramic substrates having metals joined thereto. More particularly, the invention relates to a process for producing aluminum or aluminum alloy-ceramics composite electronic circuit boards suitable for mounting highpower electronic devices such as power modules.

This invention further concerns a process for producing rugged metal-bonded-ceramic (MBC) material or components. Particularly the present invention is directed to an industrial process for producing MBC material or components of metals with oxide, nitride or carbide ceramics that are suitable for use in automotive parts, electronic parts, etc. The invention also is directed to MBC plates produced by such process, as well as electronic circuit substrates fabricated from such MBC plates.

2. Background Information

Metal-ceramics composite electronic circuit boards which have metals joined to the surface of ceramic substrates are commonly used for mounting high-power devices such as power modules. To make such composite circuit boards, copper, which has high electrical and thermal conductivities, is joined to alumina or aluminum nitride ceramics.

MBC components are extensively used in automobiles, electronic equipment and other applications by taking advantage of the chemical stability, high melting points, insulating property and high hardness of ceramics in combination with the high strength, high toughness, free workability and conducting property of metals. Typical applications of the components include rotors for automotive turbochargers, as well as substrates and packages for mounting large-power electronic elements.

MBC material and MBC components are known to be produced by various methods including adhesion, plating, metallizing, thermal spraying, brazing, direct bonding or "DBC", shrink fitting and casting.

Adhesion is a process in which a metal member is joined to a ceramic member with an organic or inorganic adhesive.

Plating is a process that comprises activating the surface of a ceramic member and dipping it in a plating bath to apply a metal plate.

Metallizing is a process that comprises applying a paste containing metal particles to the surface or a ceramic member and sintering it to form a metal layer.

Thermal spraying is a process in which molten metal (or ceramic) drops are sprayed onto the surface of a ceramic (or metal) member so that a metal (or ceramic) layer is formed on that surface.

The direct bonding process (DBC) has been developed for the particular purpose of joining copper to oxide ceramics. In the DBC method, an oxygen-containing copper member sheet is heated in an inert gas atmosphere while it is joined to a ceramic member or, alternatively, oxygen-free copper is heated in an oxidizing atmosphere, to join copper to a ceramic member, i.e., the surface of an oxygen-free copper member is first oxidized to form a copper layer then joined to a ceramic member. Thus in order to join copper to non-oxide ceramics by the DBC method, an oxide layer must first be formed on the surface of a non-oxide ceramic substrate. As disclosed in Unexamined Published Japanese Patent Application (Kokai) No. 3077/1984, an aluminum nitride substrate is first treated in air at a temperature of about 1000° C. to form an oxide on the face of the substrate and the direct bonding method is then applied to join copper to the aluminum nitride.

In brazing, copper is joined to ceramics with the use of an intermediary brazing material containing an active metal. The most common brazing material used in this method is based on a Ag—Cu—Ti system.

Brazing is a process in which metal and a ceramic member are joined with the aid of a low-melting point filler metal or alloy. To insure that the filler metal or alloy is securely joined to the ceramic member, a metal component highly reactive with ceramics is added or a metal layer is preliminarily formed on the joining surface of the ceramic member by a suitable method such as metallizing or thermal spraying.

In shrink fitting, the ceramic and metal members to be joined are provided with a projection and a cavity, respectively, in such a way that the outside diameter of the projection is equal to the inside diameter of the cavity and the metal member is heated to expand the cavity, into which the projection of the ceramic member is inserted; thereafter, the two members are cooled so that they form an integral assembly in which the projection on the ceramic member is nested in the cavity in the metal member.

Casting is similar to shrink fitting, except that a metal is cast around a ceramic member and cooled so that it shrinks to have the ceramic member nested as an integral part.

These prior art methods, however, have problems. Adhesion produces composites that are low in adhesion strength and heat resistance. The applicability of plating, metallizing and thermal spraying is usually limited to the case of forming thin metal (or ceramic) layers whose thickness ranges from a few microns to several tens of microns.

Shrink fitting and casting are applicable only to a special case in which at least part of a ceramic member is to be nested in a metal.

In DBC, copper is the only metal that can be joined and the temperature for joining must be within a narrow range close to the eutectic point of Cu—O and, hence, there is a high likelihood for the development of joining defects such as swelling and incomplete joining.

Brazing uses expensive filler metals or alloys and requires the joining operation to be performed in a vacuum and, hence, the operational cost is high enough to prevent the use of the method in a broad range of applications.

In spite of their widespread use, the copper-ceramics composite substrates have several problems associated with production and practical use. The most serious problem is that cracks can develop in the ceramic substrates during mounting electronic components and during their subsequent use, whereupon dielectric breakdown may occur across the thickness of the substrate.

In order to join copper to ceramic substrates, they are heated to almost 1,000° C. and, in addition, the copper-ceramics composite substrate is heated to almost 400° C. when mounting electronic components such as power modules. The thermal expansion coefficient of copper is higher than that of ceramics by a factor of about 10, so when the composite substrate is cooled to room temperature, the thermal expansion mismatch will cause a substantial thermal stress within the substrate.

Furthermore, on account of the environment in which the electronic components are used, as well as the heat generated during their use, the temperature of the composite substrate is subject to constant changes, which cause corresponding changes in the thermal stress on the substrate. Such thermal stresses contribute to cracking in the ceramic substrate. One of the important parameters for evaluation of ceramic electronic circuit boards is resistance to heat cycles, or the number of thermal swings between −40° C. and 125° C. that can be applied to the circuit board until cracking occurs. Copper-alumina composite substrates fabricated by the direct bonding method can withstand 20 such heat cycles but, on the other hand, similar substrates fabricated by brazing can withstand only 10 heat cycles or less.

Aluminum has comparable electrical and thermal conductivities to copper and the idea of using aluminum as a conductive circuit material has been known for many years (see, for example, Unexamined Published Japanese Patent Application (kokai) No. 121890/1984, which discusses such idea). Aluminum is softer than copper and its yield strength is about a quarter of the value for copper. Therefore, it is anticipated that the residual stress in the composite substrates could be markedly reduced by using aluminum as a circuit material. However, Unexamined Publication Japanese Patent Application (kokai) No. 121890/1984, supra, do not disclose a specific method of joining aluminum to ceramics.

Unexamined Published Japanese Patent Application (kokai) Nos. 125463/1991, 12554/1992 and 18746/1992 disclose methods of fabricating aluminum-ceramics composite substrates by brazing. According to these published Japanese patent documents, the fabricated aluminum-ceramics composite substrates can withstand at least 200 heat cycles, which is about 10 times as great as the value for the copper-ceramics composite substrate.

However, the aluminum-ceramics composite substrates that are produced by the methods disclosed in the published Japanese patent documents listed above have the following problems associated with their manufacture or subsequent use:

(1) Aluminum is highly prone to be oxidized, so the methods at issue have to be carried out in either in vacuo or in an atmosphere filled with an inert gas of high purity.

(2) The melting point of aluminum is as low as 660° C., so if the brazing temperature approaches this level, aluminum will either totally melt to lose its shape or partly melt to induce a brazing defect called "nibbling". On the other hand, if the brazing temperature is unduly low, the brazing material will not completely react with the ceramics and the resulting composite will have only a small strength. As will be described hereinabove in the Examples, the use of a brazing alloy of an Al—Si system requires that brazing be carried out within a temperature range even narrower than the range from 590° C. to 640° C. According to the experience of the present inventors, controlling the temperature in a heating furnace to reach uniformity is very difficult to accomplish in large-scale production, particularly in the case where composite substrates are to be produced in vacuo (because the heat from a heating element is transmitted solely by radiation and conduction in the absence of convection).

(3) When composite substrates are to be fabricated by brazing, the brazing temperature must not be higher than the melting point of aluminum (660° C.). However, the aluminum-based brazing material wets the ceramics only poorly at such low temperatures. Thus, failures in joining often occur if composite substrates are produced by brazing.

(4) An alumina substrate is amenable to direct brazing. However, an aluminum nitride ceramic substrate requires that its surface be oxidized as in the case of direct joining of copper. However, this is not desirable for the following two reasons: first, the overall process becomes complicated; second, the aluminum nitride substrate has been developed in order to meet the requirement for better thermal conductivity, but an oxide formed on the surface is, of course, detrimental to the thermal conduction characteristics.

(5) As in the case of copper-ceramics composite substrates, the aluminum-ceramics composite substrates fabricated by brazing would have a lower resistance to heat cycles than those fabricated by direct bonding. This is because the brazing alloys used in the fabrication of the substrates are harder than pure metals and will not readily undergo plastic deformation, thus causing untoward effects on stress relaxation.

As described above, the process of fabricating aluminum-ceramics composite substrates by brazing has several problems including instability. If the ceramic substrate is based on a non-oxide, the manufacturing process is complicated. Furthermore, the composite substrates fabricated by the prior art processes are not always considered to be optimal with respect of joint strength and heat resistance characteristics.

As already hereinabove, MBC components can be used as substrates for mounting large-power electronic elements. Currently used MBC substrates comprise ceramic substrates having copper circuit patterns formed on the surface. Depending on the kind of the ceramic substrate used and the process for producing the MBC substrates, commercial composite substrates are classified as copper/alumina directly joined substrates, copper/aluminum nitride directly joined substrates, copper/alumina brazed substrates and copper/aluminum nitride brazed substrates.

A method for producing copper/alumina directly joined substrates is described in Unexamined Published Japanese Patent Application (kokai) Sho-52-37914. In Sho-52-37914, an oxygen-containing copper plate is superimposed on an alumina substrate or, alternatively, an oxygen-free copper plate is heated in an oxidizing atmosphere to generate copper oxide on the surface of the oxygen-free copper plate, before the copper plate is joined to the alumina substrate with a composite oxide of copper and aluminum being formed at the interface.

To produce copper/aluminum nitride directly joined substrates, an oxide must first be formed on the surface of an aluminum nitride substrate. A method of production is described in Unexamined Published Japanese Patent Application (kokai) Hei 3-93687. In Hei 3-93687 the aluminum nitride substrate is first treated in air at a temperature of about 1,000° C. to form an oxide layer on the surface and, then, a copper plate is joined to the aluminum nitride substrate with an intermediate oxide layer, by the method described in the preceding paragraph.

To produce copper/alumina or aluminum nitride brazed substrates, a copper plate is joined to a ceramic substrate with the aid of a low-melting point filler metal. A commonly used filler metal is made from an alloy comprising Ag, Cu and Ti. In this case the purpose or adding Ag is to lower the melting point and the purpose of adding Ti is to enhance the wettability of the filler metal to ceramics.

In spite of their common use, copper/ceramic composite substrates have several problems that are encountered during fabrication and actual use. The most serious problem is that cracks develop in the ceramic substrate during the mounting of electronic element and during the use of thus assembled electronic devices. This defect is attributable to the thermal expansion coefficient of copper, which is higher than that of ceramics by about one order of magnitude.

During the joining operation, both the ceramic substrate and copper are heated to about 1,000° C. and as they are cooled from the joining temperature to room temperature, considerable thermal stress therefore develops within the MBC substrate due to the thermal expansion difference. When mounting electronic elements on MBC substrates, the latter are heated to about 400° C. and also the temperature of the MBC substrate constantly change due to the temperature change in the operating environment or due to the generation of heat during the use of the assembled electronic devices, whereby the MBC substrates are subjected to varying thermal stresses. On account of these thermal stresses, cracks develop in the ceramic substrate.

An important factor regarding the evaluation of the MBC substrates is resistance to heat cycles. This factor is expressed by the number of times a substrate can be subjected to repeated heating and cooling cycles between −40° C. and 125° C. without developing cracks due to thermal stresses. The copper-bonded-ceramic substrates can withstand only several tens of heat cycles under the indicated conditions. Moreover, in order to acquire resistance to the heat cycles, the thickness of the ceramic substrate has to be greater than the sum of the thicknesses of copper plates joined to both principal surfaces of the ceramic substrate. This means that the thickness of the ceramic substrate must be increased beyond the value necessary to maintain its inherent electrical insulating property. As a result, heat conduction, which is another important characteristic of the MBC substrates, is sacrificed.

In recent years, the development of power modules for installation on electric cars has increased the demand for MBC substrates having improved resistance to heat cycles. Under severe use conditions as in electric cars where temperatures changes are violent and great vibrations occur, resistance to 3,000 heat cycles and more is said to be necessary. However, this requirement cannot be met by the copper-bonded-ceramic substrates in current use.

Aluminum is as good an electric and heat conductor as copper and the idea of using it as a conductive circuit material is described in Unexamined Published Japanese Patent Application (kokai) Sho 59-121890. Generally brazing is used to join aluminum and ceramics and Unexamined Published Japanese Patent Applications (kokai) Hei 3-125463, Hei 4-12554 and Hei 4-18746 teach aluminum-ceramic substrates produced by brazing. These substrates can withstand about 200 heat cycles, but they are still unsuitable for use in electric cars and in other applications where very high resistance to heat cycles is required. As a further problem, brazing must be conducted in a vacuum and nonoxide ceramics must be subjected to a preliminary treatment for forming an oxide on the surface and this makes the brazing process unsatisfactory in terms of not only production cost, but also heat conduction.

Thus, the prior techniques for joining metal and ceramic members have had one or more of the following problems:

(1) the metal and ceramic members to be joined are limited to those having certain shapes;

(2) the joining step is costly and limited in the scope of applications; and (3) the joined members do not meet the performance requirements for joint strength, heat resistance and resistance to heat cycles.

SUMMARY OF THE INVENTION

The present invention has been accomplished under these circumstances and has an object of providing a consistent and convenient process for producing aluminum or aluminum alloy-ceramics composite substrates having better joint strength, thermal conductivity and heat resistance characteristics.

The present invention has also been accomplished to solve the above described problems of the prior art and has as an object of providing a process by which MBC material or MBC components of many various shapes having improved characteristics can be manufactured at low cost.

Another object of the present invention is to provide MBC plates produced by that process.

A further object of the present invention is to provide MBC electronic circuit substrates that are fabricated from the MBC plates.

The present inventors conducted intensive studies in order to attain this object. As a result, they found a novel process for producing the desired aluminum or aluminum alloy-ceramics composite substrates. The present invention has been accomplished on the basis of this finding.

Thus, the present invention relates to a process for producing a ceramics electronic circuit board having a metal conductor circuit on at least one surface of a ceramic substrate, which comprises the following steps: (a) melting a metal for forming the conductor circuit and then pouring the melt into a mold or, alternatively, melting the metal within the mold; (b) bringing the molten metal into direct contact with the ceramic substrate which has been placed at a specified site in the mold or which is inserted into the molten metal, and (c) holding the ceramic substrate and the molten metal as they are in contact with each other and subsequently cooling them such that the metal is directly joined to the ceramic substrate.

It should be noted here that the terms "direct contact" or "direct joining" herein used with respect to a molten metal and a ceramics substrate means that a molten metal is placed in contact with the fresh surface of ceramics without an intervening oxide film between the metal and the ceramics so that the metal and the ceramics may be joined to each other without the intervening oxide film. In a preferred embodiment, the metal is aluminum or an alloy thereof and the ceramic substrate is alumina, aluminum nitride or silicon nitride, although any other ceramics that are suitable for mounting electronic devices can also be used.

The present invention provides an effective method of bonding molten metals to ceramics, as well as an effective method of shaping metals.

The present invention provides a process for producing MBC material or MBC components 15 having a metal joined to at least part of ceramic members 12, wherein the ceramic members 12 are moved as they are kept in contact with the melt 11 of the metal so that they are wetted by the melt, followed by cooling, so that the melt solidifies on the surface of the ceramic members 12 to be joined to the latter.

In one embodiment, the ceramic member 12 is moved as the part thereof to be joined to the metal is kept in contact with the melt 11 of the metal so that it is wetted by the melt 1 and, thereafter, the metal melt 11 or part thereof is allowed to solidify in a selected area of the ceramic member 2 so that a metal part of a predetermined shape will form.

In another embodiment, the ceramic member 12 is supplied continuously to the metal melt 11 and moved as the part thereof to be joined to the metal is kept in contact with the metal melt 11, so that it is wetted by the metal melt 11 and, thereafter, the ceramic member 2 is recovered so that part of the metal melt 1 solidifies in a selected area of the ceramic member 12 to form a metal part of a predetermined shape.

In yet another embodiment, that part of the ceramic member 12 to be joined to the metal is fed continuously into the metal melt 11 from one side thereof and, after it is wetted fully by the metal melt 11, the ceramic member 12 is passed through a die 16 in a direction away from the melt so that part of the metal melt 11 solidifies in a selected area of the ceramic member 12 to form a metal part of a predetermined shape.

In a further embodiment, the ceramic portion of the MBC material or a MBC component that has a metal joined preliminarily to part of the ceramic member 12 is fed through die 16 at inlet portion 16A into the melt of a joining metal having a lower melting point than the joined metal and, after it is wetted fully by the metal melt, the ceramic portion which is passed through the die 16 in a direction away from the melt towards outlet portion 16B, so that part of the low-melting point metal melt solidifies in a selected area of the MBC material or a MBC component having the high-melting point metal joined thereto, thereby forming a low-melting point metal part of a predetermined shape.

In a still further embodiment, the ceramic member or portion is made of an oxide, a nitride or a carbide.

In another embodiment, the metal is aluminum, copper, iron, nickel, silver or gold or an alloy based on one of these metals.

In an aspect of the present invention, a MBC plate member is provided wherein a metal plate is formed on a ceramic substrate by any one of the processes described above.

In another aspect of the present invention, a MBC electronic circuit substrate is provided wherein a predetermined circuit pattern is formed by etching the metal plate of the MBC plate member described above.

DETAILED DESCRIPTION OF THE INVENTION

Figure 1:
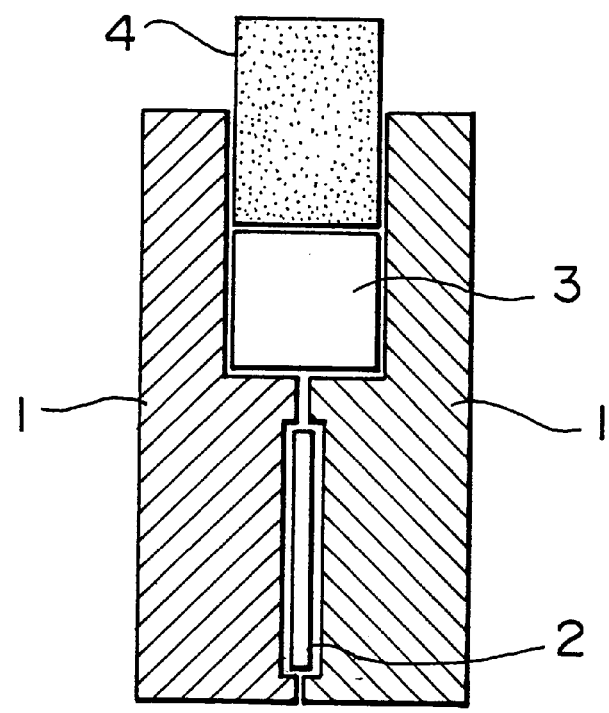
FIG. 1 is a sectional view of a mold used in fabricating aluminum ceramics composite substrates in an example of the present invention.

According to the previous studies of the present inventors, aluminum and other chemically active metals cannot be joined to ceramics by heating in an air atmosphere, since a thick oxide (alumina) layer is formed on a surface of aluminum whereupon the metals lose their inherent ability to be joined to ceramics. The two substances can be joined in either in vacuo or in an inert gas atmosphere, but the presence of a thin oxide layer detected at the interface of the joint indicates that aluminum is joined to the ceramic substrate via the thin oxide film on the surface of aluminum. Aluminum covered with alumina wets the ceramics only poorly and failures in joining have frequently occurred at the interface between the two members, thereby causing fluctuations in the strength of the joint of aluminum and ceramics.

Additionally, it is well known to those skilled in the art that strong joints cannot be realized unless the joining operation is preceded by degreasing in order to remove oil from the surfaces of the members to be joined.

With a view to controlling the adverse effects of the oxide film formed on the aluminum surface, the present inventors have been engaged in the study of the effects of Si, Ti and other alloying elements added to aluminum. As a result, it has been verified that Si is effective in reducing the thickness of the surface oxide film while Ti is capable of promoting the interfacial reaction, and the simultaneous addition of Si and Ti is the most effective for improving the strength and stability of the joined product. However, in each of the tested cases, an oxide was detected at the interface of the joined product, indicating that aluminum was still joined to ceramics via the intervening oxide film.

The oxide alumina on the surface of aluminum is chemically very stable and will not easily react with other substances. Therefore, if alumina were present at the interface between aluminum and a ceramic substrate, effective joining of the two materials would be prevented.

In the previous studies conducted by the present inventors on sinters of aluminum and ceramic powders, it was found that certain areas of aluminum particles joined direct to ceramic particles in the absence of an oxide film, thereby forming the product of reaction between aluminum and ceramics. This can be explained as follows: when the aluminum and ceramic powders were mixed and shaped under pressure, the oxide film on the surfaces of aluminum particles disrupted, allowing the aluminum and ceramic particles to make direct contact with each other during heating. This phenomenon suggests the possibility of direct joining of aluminum to ceramics.

The present inventors made various attempts at removing the oxide film from the surface of aluminum so as to fabricate satisfactory metal ceramics composite substrates. As a result, the following techniques have been found to be effective:

(1) After melting a metal, a relative movement is caused to occur between the molten metal and a ceramic substrate in order to disrupt the oxide film on the surface of the melt. Stated more specifically, the melt is poured into a mold after the ceramic substrate has been placed at a predetermined site in the mold or, alternatively, the ceramic substrate is inserted into the molten metal that has been poured into the mold, whereby a relative movement is allowed to take place between the ceramic substrate and the molten metal;

(2) the oxide film on the metal surface is prone to decompose at higher temperatures, so it is preferred to increase the temperature of the molten metal. However, in order to heat the molten metal to higher temperatures, additional energy is required and, what is more, the intensive heating of the molten metal causes untoward effects such as accelerated evaporation of the melt and vigorous reaction between the melt and the mold. Hence, an appropriate temperature of the melt is within the range from 700° C. to 1,000° C. and integrity is guaranteed for the composite substrates fabricated in this temperature range.

(3) In order to minimize the oxidation of the surface of the melt, its pouring into the mold and the insertion of the ceramic substrate into the melt should be accomplished as quickly as possible. The production of composite substrates may be performed in the air atmosphere; however, in order to prevent oxidation, the melting of a metal and the pouring into the mold are preferably performed in either vacuo or an inert gas atmosphere.

The first step for achieving physical or chemical joining is cleaning the surfaces to be joined.

As shown in FIG. 1, according to the present invention, a ceramic member 2 is inserted into the metal melt 1 or the latter is cast in a mold with the ceramic member 2 being preset in it, thereby creating a relative movement between the melt 1 and the ceramic member 2 to produce a clean interface between the melt and the ceramic member so that the metal can be joined securely to the ceramic member.

It should be noted that the electronic circuit patterns may be formed by one of two following methods: (i) forming a circuit pattern on the inner surface of a mold so that the intended pattern can be established directly; and (ii) first forming a solid aluminum or aluminum alloy layer and then performing etching to produce the intended circuit pattern.

Figure 2:
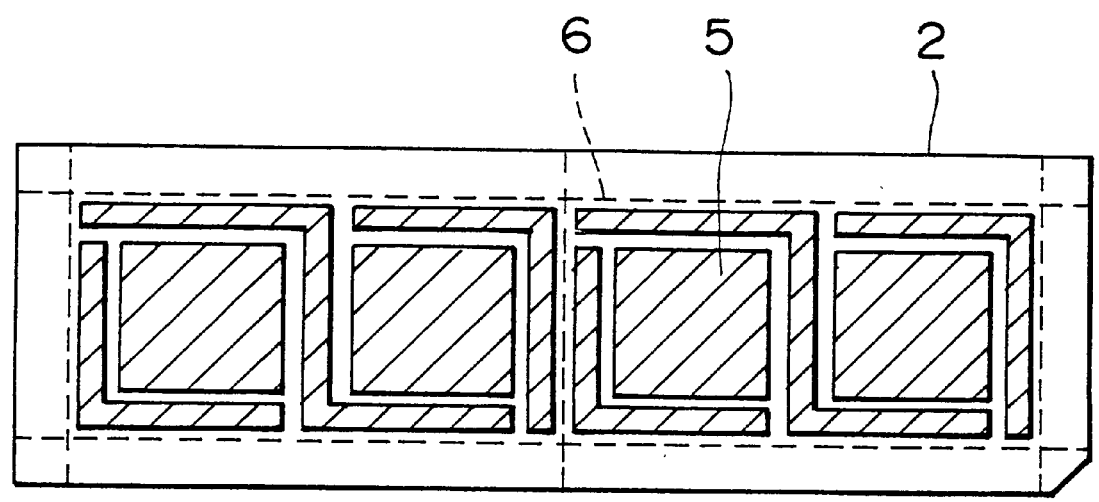
FIG. 2 is a plan view of an example of a ceramic electronic circuit substrate having a circuit pattern formed by etching the aluminum layer on the surface of the aluminum-ceramics composite prepared by the method of the present invention.

One typical example of a ceramic electronic circuit substrate board having the circuit pattern formed by the method (ii) mentioned above is shown in FIG. 2, wherein 2 represents ceramics substrate, 5 represents electronic circuit pattern and 6 represents a break line.

Metals are joined to ceramics in one of three modes, mechanical, physical and chemical, which are designated according to the joining mechanism involved. Mechanical joining is achieved when a projection on a ceramic member is nested in a cavity in a metal member by a mechanical force as in the case of joining the two members by shrink fitting or casting. Mechanical joining is also achieved if, as in the case of adhesion, an adhesive gets into recesses in the surfaces of the ceramic and metal members to exhibit an "anchor" effect when cured, thus producing an integral assembly of the metal and ceramic members.

Physical joining is achieved by the force of attraction (van der Waals forces) acting between the molecules of a ceramic member and metal atoms.

Chemical joining is achieved by covalent bonding (sharing) or ionic bonding (transfer) between electrons within a ceramic molecule and those in a metal atom. Since chemical bonding is established if electronic sharing or transfer occurs between surface molecules (electrons) of a ceramic and a metal member, reaction products that can be discovered by physical means (e.g., common optical microscope, SEMs and TEMs) will not necessarily exist at the interface between the ceramic and metal members. In this case, it is often difficult to distinguish physical joining from chemical joining, solely in view of the state of the interface. As a matter of fact, there are many cases where several joining mechanisms occur simultaneously at the interface between the members to be joined, but in order to achieve reliable joining, it is essential that either physical or chemical joining be accomplished.

Whether the joining that occurs is physical or chemical, is frequently determined by the state of wetting. Generally speaking, a drop of a liquid placed on a solid will spread until it reaches an equilibrium after the lapse of a certain time.

Suppose the line of contact among the three phases of a liquid-solid-gas (atmosphere) system is at equilibrium. If a tangent is drawn to the liquid at its contact with the solid and the angle of contact is the angle between the tangent and the surface of the solid, as measured on the side, the liquid drop is present. The thus measured angle of contact is an indication of the state of wetting of the solid by the liquid. When physical or chemical joining occurs, the angle of contact generally decreases. In the present invention, the state or wetting is investigated by the following simpler and more practical procedure. That is, the ceramic member 12 is brought into contact with the metal melt 11 which has been heated at a given temperature; after the lapse of a certain time, the ceramic member 12 is taken out of the melt 11; the metal that adheres loosely to the cooled surface of the ceramic member 12 is scraped-off and the state of wetting of the ceramic member 12 by the metal is investigated.

A process of the present invention comprises the following steps: (1) inserting the ceramic member 12 into the metal melt 11 by moving the ceramic member 12 through the metal melt 11 until at least part of the ceramic member 12 that is to be joined to the metal is wetted by the metal melt 11 and (2) recovering the ceramic member 12 from the metal melt 11 by passing it through a die 16 worked to a predetermined shape, so that part of the metal melt 11 solidifies in a predetermined shape in a predetermined area of the ceramic member 12.

It is stressed that the surface cleaning described above does not necessarily mean the removal of all ingredients other than the components from which the members to be joined are made. To the contrary, if the ingredients are capable of promoting physical or chemical joining, such capability should be positively utilized. Take, for example, the case of DBC in which the presence of an oxide on the surface of ceramic members to be joined is a prerequisite for the creation of a strong joint; to satisfy this requirement, the surface of a nonoxide ceramic member has to be oxidized so that an oxide layer is formed. Thus, the purpose of "cleaning" in the present invention is limited to removing any ingredients that can be harmful to the creation of physical or chemical joining.

Figure 4:
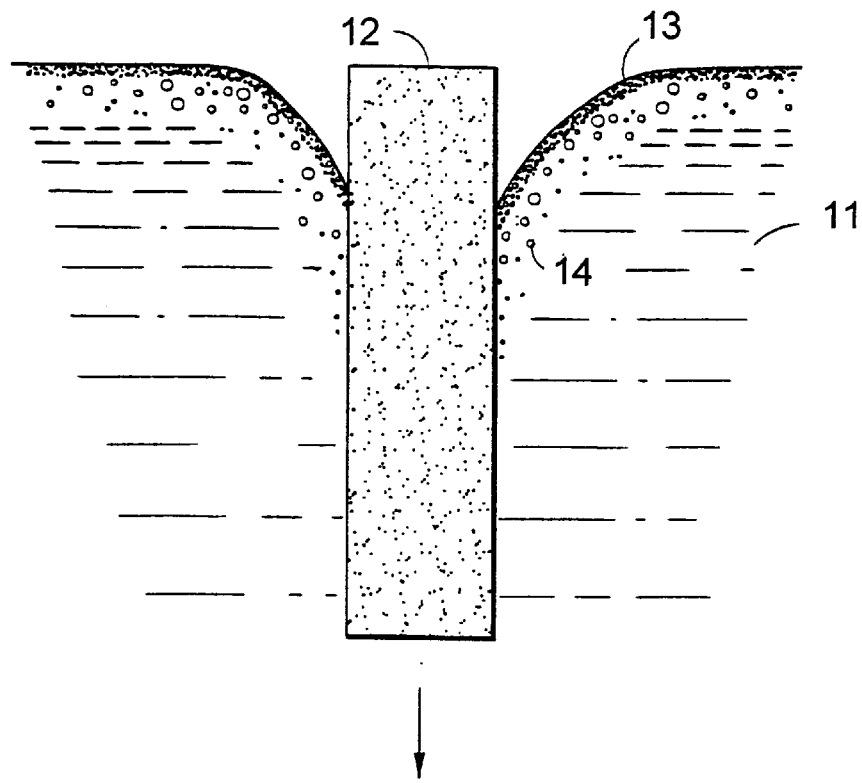
FIG. 4 is a perspective view showing an embodiment of the invention.

FIG. 4 is a diagram showing a basic concept of an embodiment of the invention. If the ceramic member 12 is to be moved through the metal melt only a small distance, it is insufficient to assure complete removal of the deleterious ingredient 4 on the surface of the ceramic member and the deleterious ingredient 13 on the surface of the metal melt; as a result, part of the ceramic member 12 remains unwetted by the metal 11, making it impossible to accomplish secure joining between the ceramic member and the metal. In order to avoid this incomplete joining, the distance over which the ceramic member 12 is moved through the metal melt 11 must exceed a certain minimum value (Dmin). This minimum value is variable with many factors such as the characteristics of the metal 11 and the ceramic member 12, as well as the status of any deleterious ingredients on their surfaces, the temperature, the atmosphere and the rate of movement of the ceramic member 12. In the examples of the invention to be described hereinafter, the minimum distance (Dmin) ranges from a few millimeters to several tens of millimeters.

The minimum distance of relative movement (Dmin) is preferably 8 mm or more, more preferably 20 mm or more and most preferably 55 mm or more.

Figure 3:
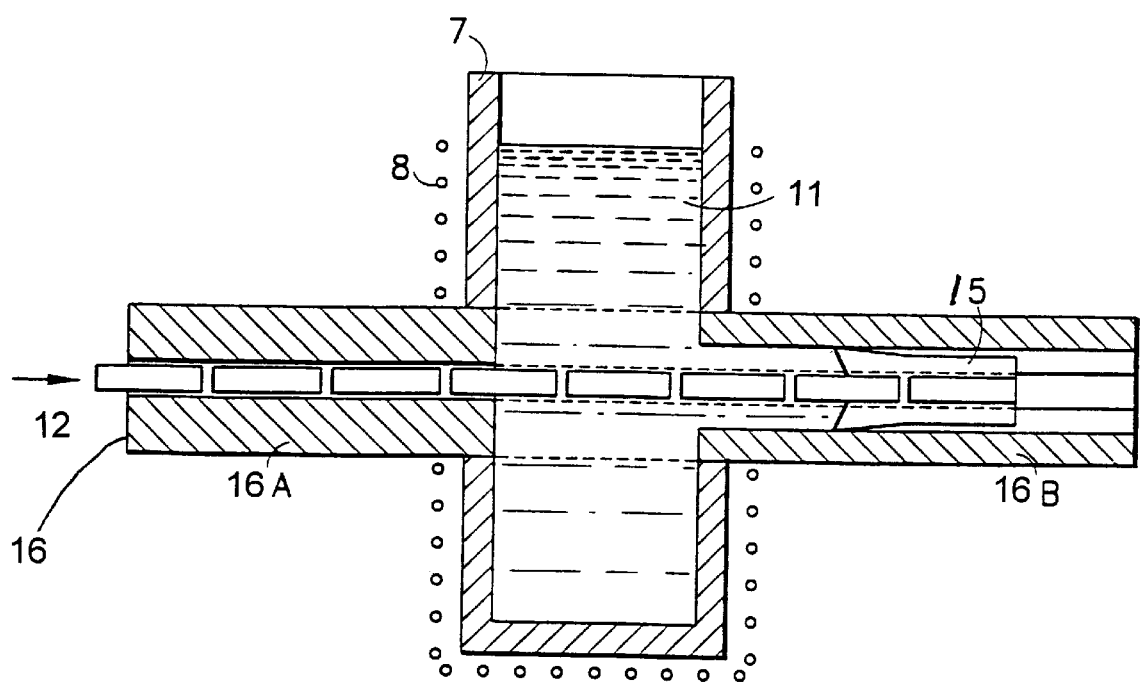
FIG. 3 is a schematic view of the apparatus used in Examples 2 to 7 set forth hereinbelow to form MBC material or components.
Figure 5:
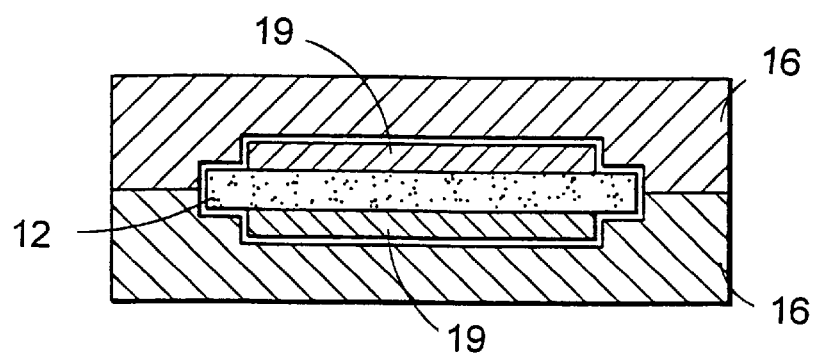
FIG. 5 is a sectional view showing the cross-section of a die used in Example 2 set forth hereinbelow to manufacture MBC material.
Figure 6:
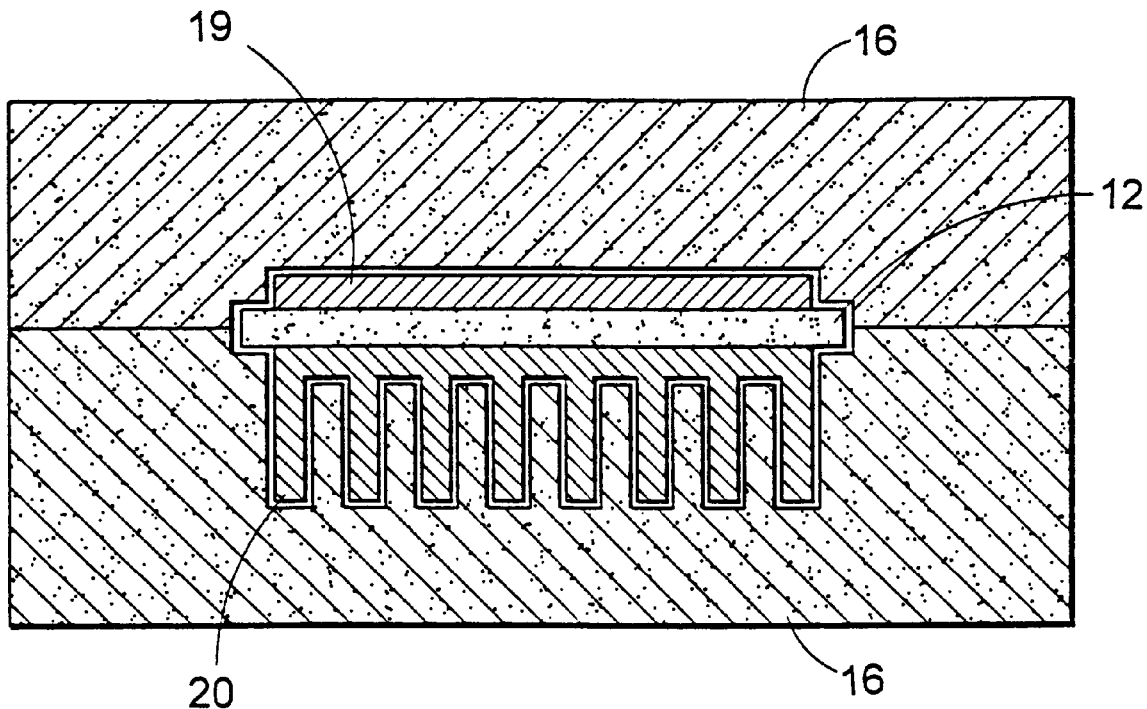
FIG. 6 is a sectional view showing the cross-section of the die used in Example 3 set forth hereinbelow to manufacture MBC material.
Figure 7:
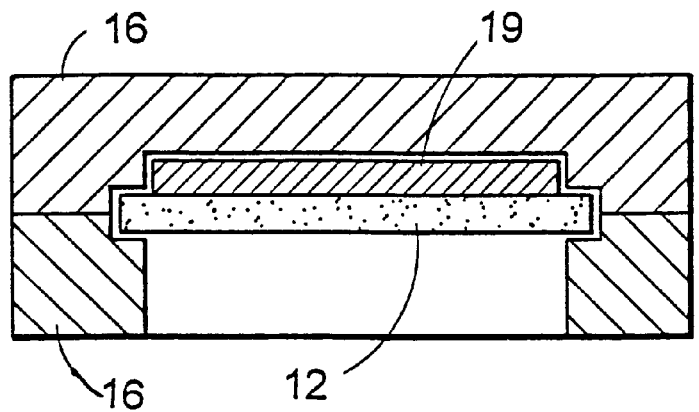
FIG. 7 is a sectional view showing the cross-section of the die used in Example 4 set forth hereinbelow to manufacture MBC material.

In Example 2 to be described hereinafter, there is disclosed an exemplary process for producing the MBC material 15. FIG. 3 is a schematic section of the apparatus for implementing the process and FIG. 5 is a sectional view showing the cross-section of the die 16. The ceramic member 12 is fed successively into the molten metal 11 through the guide 16A linked to the die 16B and, after being thoroughly wetted by the melt, exits from the die 16B to form a metal part of a predetermined shape in a predetermined area of the ceramic member 12. The resulting MBC material 15 is structurally integral if the dimension of the melt in the moving direction of the ceramic member 12 is set to be longer than the minimum distance required for the ceramic member 12 to be wetted by the melt. In FIG. 5, FIG. 6 and FIG. 7, reference numeral 19 represents bonded aluminum.

The example described above is strictly intended to illustrate the essence of the invention. While the process disclosed by that example is clearly one of the approaches that can be taken to attain the objects of the invention, it will readily be understood that the invention is by no means limited to this particular process. In all the examples to be described hereinafter, the melt and the ceramic member 12 are made of aluminum and alumina, respectively, but it should also be understood in the light of the above-described spirit of the invention that they are by no means limited to aluminum and alumina.

Combinations of other metals and ceramics may equally be applicable as long as the ceramic member 12 can be wetted by the molten metal 11. The ceramic member 12 need not even be wetted by certain metals only if it can be modified or wetting accelerators can be added to the metals so as to improve the wetting of the ceramic member 12 by the molten metal 11. This method is also applicable to the invention with good results. Consider, for example, the case of producing a copper-bonded-aluminum nitride material using copper and an aluminum nitride member; the surface of the ceramic member may preliminarily be oxidized to form an oxide such as alumina, or the molten copper is exposed to air, supplemented with copper oxide or otherwise treated to incorporate oxygen, whereby the wetting of the ceramic member 12 with the molten copper is sufficiently improved to ensure the production of a composite in which the ceramic member 12 is securely joined to the metal part. When producing an alumina-silver composite, a similarly strong joint can be obtained by adding titanium or other active metals to the molten silver.

Needless to say, the temperature, the atmosphere and the rate of movement of the ceramic member 12 are very important parameters for the purposes of the present invention. However, different metals and ceramic members 12 have different characteristics and, hence, these parameters are variable with the members that are to be joined. These conditions should be selected in such a way that the ceramic member 12 will be effectively wetted by the molten metal 11. The proper selection of these conditions is an important step for assuring that the advantages of the invention will be exhibited to the fullest extent. When selecting these conditions one must take the following point into account: in the process of the invention, effective wetting is essential for producing the MBC material or components 15 and raising the temperature of the melt or extending the contact time is certainly effective for the purpose of improving the wetting. However, if the temperature of the melt or the contact time is increased unduly, the metal member and the ceramic member 12 will react to form a thick reaction product at their interface, which can potentially lower the strength of the joint between the two members.

By using the process of the invention, the present inventors could produce MBC plate members and they could also fabricate MBC electronic circuit substrates by etching the metal portion of the MBC plate members. Before forming metal circuit patterns by etching, the MBC plate members produced by the process of the invention has to be separated by shearing at the connecting portions of the ceramic substrates and it is also necessary to form resist patterns on a polished surface of the metal portion. Resist patterns can be formed by various methods. In one method, a light-sensitive resist film, is compressed onto the surface of the metal portion, exposed to light through an overlying pattern mask, and developed to remove the resist in the unwanted areas. Alternatively, a layer of liquid resist is printed in a predetermined pattern directly onto the metal and exposed to UV light to cure the resist. After these pretreatments, an etching solution is sprayed onto the composite substrate having the resist patterns formed thereon and the metal is removed from the resist-free areas to form metal circuit patterns of predetermined shapes.

The present invention concerns electronic circuit substrates comprising aluminum-ceramic composite material made from a metal comprising aluminum or an aluminum alloy and a ceramic material selected from the group consisting of alumina, aluminum nitride and silicon nitride. The aluminum alloy contains at least 80 weight % aluminum.

An electronic circuit is formed on aluminum or an aluminum alloy plate of the aluminum ceramic composite material which is prepared by directly solidifying molten aluminum (or an aluminum alloy) on at least a portion of a ceramic substrate. The electronic circuit can be formed by etching. The electronic circuit substrate has a peel strength of not lower than 30 kg/cm and preferably not lower than 35 kg/cm, and has a heat cycle characteristic of not lower than 1000 cycles, preferably not lower than 3000 cycles.

The temperature ranges for carrying out the bonding of metal to ceramic in the present invention are at or above the melting point of the metal to be bonded.

In the case of aluminum, the temperature is not lower than the melting point of aluminum (660° C.), i.e., a temperature at or above 660° C. From an economical point of view, the temperature may be less than 1000° C., i.e., a temperature range for aluminum of 660° C. to 1000° C.

In the case of an aluminum alloy, the temperature should be in a range from the liquidus of the alloy (which should be somewhat lower than 660° C.) to 1000° C.

A preferred temperature range for carrying out the bonding of metal to ceramic in the present invention is 700° C. to 900° C.

In the examples to be described hereinafter, alumina and aluminum nitride substrates were used as ceramic substrates, but it is contemplated that other ceramic substrates made of silicon nitride, silicon carbide, zirconia, etc., as well as various glass substrates are also applicable with equally good results. As for the metal to be composited with the ceramic member, pure aluminum metal was used since it was a good electric conductor that would also insure softness. The purity of the aluminum used was 99.9% (3 N) in order to achieve a balance between the electric conductivity (which increases with the purity) and the price. However, it should of course be understood that this is not the sole case of the present invention.

EXAMPLES

The following examples are provided for the purpose of further illustrating, with reference to the accompanying drawings, the process of the invention and the electronic circuit substrate that can be fabricated by the process.

The following examples and comparative examples are provided for the purpose of further illustrating the present invention but are in no way to be taken as limiting.

Example 1

As shown in FIG. 1, a graphite mold 1 was fitted in its interior with a ceramic (alumina, aluminum nitride, or silicon nitride) substrate 2 having a thickness of 0.635 mm, as well as an aluminum feed 3 and a graphite piston 4. The assembly was put in a heating furnace controlled at four different temperatures of 700° C. (Run 1), 800° C. (Run 2), 900° C. (Run 3) and 1000° C. (Run 4). The aluminum feed melted and, under the weight of the graphite piston, it flowed into the area where the ceramic (alumina, aluminum nitride or silicon nitride) substrate was placed. Thereafter, the mold 1 was taken out of a heating furnace and cooled to room temperature. In this example, the heating and cooling operations were performed in a nitrogen atmosphere in order to prevent oxidation of the graphite mold. The thus fabricated composite substrates each having a 0.5 mm thick aluminum layer on each side were subjected to both mechanical polishing and electropolishing and their aluminum structure was examined under an optical microscope. Samples 4 mm wide were sliced from each of these composite substrates and tested for their 90° peel strength.

Irrespective of the heating temperature employed, the tested composite substrates had very dense structures in their aluminum portions and they were entirely free from voids, porosity and any other defects that are commonly found in castings. As the following Table 1 shows, the composite substrates had strengths of at least 35 kg/cm and rupture did not occur at the interface between aluminum and ceramics (alumina, aluminum nitride or silicon nitride), but within aluminum. It was therefore found that aluminum adhered firmly to the ceramics substrate. As for failures in joining, some were found in the samples fabricated at 700° C., but none occurred in the samples fabricated at temperatures of 800° C. and above.

TABLE 1

|  |  | Ceramic substrate | Brazing material | Atmosphere | Fabrication temperature, ° C. | Aluminum structure | Peel strength, kg/cm |
|---|---|---|---|---|---|---|---|
| Experiment | 1 | alumina | — | $N_2$ gas | 700 | good | >35 |
|  | 2 | alumina | — | $N_2$ gas | 800 | good | >35 |
|  | 3 | alumina | — | $N_2$ gas | 900 | good | >35 |
|  | 4 | alumina | — | $N_2$ gas | 1000 | good | >35 |
|  | 5 | aluminum nitride | — | $N_2$ gas | 700 | good | >35 |
|  | 6 | aluminum nitride | — | $N_2$ gas | 800 | good | >35 |
|  | 7 | aluminum nitride | — | $N_2$ gas | 900 | good | >35 |
|  | 8 | aluminum nitride | — | $N_2$ gas | 1000 | good | >35 |
|  | 9 | silicon nitride | — | $N_2$ gas | 700 | good | >35 |
|  | 10 | silicon nitride | — | $N_2$ gas | 800 | good | >35 |
|  | 11 | silicon nitride | — | $N_2$ gas | 900 | good | >35 |
|  | 12 | silicon nitride | — | $N_2$ gas | 1000 | good | >35 |
| Comparative Example | 1 | aluminum nitride | LS | high vacuum | 650 | poor | 0.9 |
|  | 2 | aluminum nitride | MS | high vacuum | 650 | poor | 2.5 ** |
|  | 3 | aluminum nitride | HS | high vacuum | 650 | poor | 2.5 ** |
|  | 4 | alumina | LS | high vacuum | 650 | poor | 20 ** |

TABLE 1-continued

| | Ceramic substrate | Brazing material | Atmosphere | Fabrication temperature, °C. | Aluminum structure | Peel strength, kg/cm |
|---|---|---|---|---|---|---|
| 5 | alumina | MS | high vacuum | 650 | poor | 23 ** |
| 6 | alumina | HS | high vacuum | 650 | poor | 29 ** |
| 7 | alumina | LS | high vacuum | 640 | good | 0 |
| 8 | alumina | HS | high vacuum | 640 | poor | 18 ** |
| 9 | alumina | HS | high vacuum | 580 | good | 0 |
| 10 | alumina | HS | high vacuum | 590 | poor | 0 |

\* unjoined area < 10%
\*\* unjoined area > 10%

One will readily understand from the foregoing description that the method described in Example 1 is not the sole method that can be used in the present invention and that the invention is by no means limited to the conditions set forth in Example 1. The desired composite substrate can be produced by various methods including high-pressure casting, die casting and continuous casting. One will readily understand that the composite substrate can be fabricated at lower temperatures, if the time of holding at the manufacturing temperature is prolonged and if alloying elements that aid in the decomposition and activation of the surface oxide or melting point reducing alloying elements, as exemplified by Si, Ge, Ti and Mg, are added to aluminum, thereby allowing the sintering aid in the ceramic substrate to have a composition that can easily react with aluminum or if the amount of the sintering aid is increased by certain means.

Comparative Examples 1–6

For comparison, aluminum-ceramics composite substrates were fabricated by brazing.

A ceramic substrate 0.63 mm thick was held between two aluminum sheets 0.5 mm thick, with a brazing material interposed between the ceramic substrate and each aluminum sheet. A weight was put on the setup, which was hold at 650° C. for 20 minutes in high vacuo ($10^{-5}$ Torr) , whereby the aluminum sheets were brazed to the ceramic substrate. Two ceramic substrates were used and they were an alumina substrate and an aluminum nitride substrate. The brazing material was an Al—Si—Ti alloy foil 0.2 mm thick and it was adjusted to have three compositions as shown in Table 2. The thus fabricated composite substrates were evaluated by the same method as described in Example 1.

TABLE 2

| Brazing material | Composition, wt. % | | |
|---|---|---|---|
| | Si | Ti | Al |
| LS | 0.3 | 0.25 | balance |
| MS | 1.5 | 0.2 | balance |
| HS | 12 | 0.2 | balance |

The results of evaluation of the composite substrates fabricated in Comparative Examples 1–6 are shown in Table 1 together with the data for the composite substrates fabricated in Example 1. As for the samples fabricated by brazing with HS, the aluminum sheets melted to lose shape. In the samples fabricated by brazing with MS and LS, not all but a substantial part of the aluminum sheets melted to develop a brazing defect called "nibbling". The samples of Comparative Examples 1–6 had peel strengths of less than 30 kg/cm and, in particular, the samples using aluminum nitride sheets had peel strengths of 2.5 kg/cm and below, which were lower than the value required for a practical composite substrate (5 kg/cm). Furthermore, the composite substrates fabricated in Comparative Example 1–6 had unjoined portions that accounted for at least about 10% of the total area of the substrate.

Comparative Examples 7 and 8

Aluminum-alumina composite substrates were fabricated using brazing materials LS and MS as in Comparative Examples 1–6, except that the brazing temperature was lowered by 10° C. to 640° C. in order that the aluminum sheets would be prevented from melting. However, as shown in Table 1, brazing with LS was impossible at the test temperature. Brazing with MS was possible but the resulting composite substrate had a lower peel strength than the sample produced by brazing at 650° C. and the above-described problems of "nibbling" and "failures in joining" still occurred. If the brazing temperature were further lowered, the nibbling defect could be eliminated but, on the other hand, the failures in joining could increase.

Comparative Examples 9 and 10

It was attempted to fabricate an aluminum-alumina composite substrate with the brazing temperature lowered to the melting point of the brazing material HS (ca. 580° C.). However, the ceramic substrate did not join with the brazing material at that low temperature. When brazing was performed at 590° C. (Comparative Example 10), the aluminum sheets partly melted to develop a "nibbling" defect. It was therefore clear that the brazing temperature could not be increased any further.

As will be understood from Comparative Examples 1–10, the aluminum ceramics composite substrates fabricated by brazing had lower joint strength and higher probability for the occurrence of failures in joining than the samples of the present invention prepared by the direct method.

According to the method of the invention described herein, failures in joining and other defects which have occurred in the conventional brazing method are eliminated to ensure that aluminum is joined to ceramic substrates with high reliability to achieve high joint strength. As a result, one can produce quality aluminum-ceramics composite substrates having high resistance to heat cycles.

Example 2

The experimental setup shown in FIG. 3 was used; the die 16B on the exit side had the cross-section shown in FIG. 5. Aluminum was set in a crucible 17. Alumina plates were fed from the inlet into the guide (die) 16A and it was set in such a way that its forward end would protrude a little from the inner surface of the crucible 17. The crucible 17 was heated in a nitrogen ($N_2$) gas atmosphere to melt the aluminum. The molten aluminum entered the die 16B on the exit side and as it flowed through the die, the temperature of its advancing end dropped below the melting point of aluminum and solidified to clog the exit of the die, thereby preventing the melt from flowing out. In order to ensure that the melt would not get into the guide (die) 16A on the entrance side or into the space between the die 16 and the crucible 17, the clearance has to be smaller than a certain value.

In Example 2, the clearance was set to be smaller than 0.1 mm. After the molten aluminum was heated to a preset temperature, the alumina plates were fed successively into the guide 16A on the entrance side. The alumina plates entered the molten aluminum successively, were wetted by the melt, entered the die 16B on the exit side, and were finally extruded from the exit successively, with an aluminum part 0.5 mm thick joining to both surfaces of each alumina plate.

In Example 2, the minimum distance Dmin over which each alumina plate moved until it was wetted by aluminum melt was measured with the heating temperature, extruding temperature and the flow rate of nitrogen gas being set at various values. Samples were sliced from the thus prepared aluminum-bonded-alumina plates. For the Dmin measurement, the crucible 17 was emptied of the melt and the alumina plate was recovered and the distance between the point where it started to contact the aluminum melt and the area that was completely wetted by the melt was measured. The results are shown in Table 3 for the samples prepared. All samples except Lot E were characterized by a dense aluminum structure and had peel strengths in excess of 35 kg/cm. Thus, aluminum-bonded-alumina plates of satisfactory quality could be produced by the process of the invention.

TABLE 3

| Lot | Melt temperature, °C. | Extrusion Speed, mm/min | $N_2$ flow rate, L/min | Dmin, mm | Aluminum structure | Peel strength kg/cm |
| --- | --- | --- | --- | --- | --- | --- |
| A | 700 | 25 | 30 | 55 | good | >35 |
| B | 800 | 25 | 30 | 35 | good | >35 |
| C | 850 | 25 | 30 | 14 | good | >35 |
| D | 900 | 25 | 30 | 9 | good | >35 |
| E | 900 | 50 | 30 | 23 | with cavities | — |
| F | 900 | 25 | 10 | 87 | good | >35 |

Example 3

Aluminum-bonded-alumina plates having heat-dissipating fins 20 (see FIG. 6) on one side were produced by repeating the procedure of Example 2, except for the following points: the die 16B on the exit side had an interior as shown in cross-section in FIG. 6; the melt temperature, extrusion speed and the flow rate of nitrogen gas were set at 850° C., 25 mm/minute and 30 L/minute, respectively; a pressure of 0.5 kg/cm$^2$ was applied to the melt to accelerate its run and to prevent the formation of cavities. The MBC material thus produced had satisfactory quality.

Example 4

MBC material having copper plates on one side and aluminum heat-dissipating fins 20 on the other side were produced by repeating the procedure of Example 3, except for the following points: the alumina plates had a copper plate joined to one surface by DBC; the guide in the melt was worked to have the cross-sectional shape shown in FIG. 7. The MBC material thus produced had satisfactory quality.

Example 5

Figure 8:
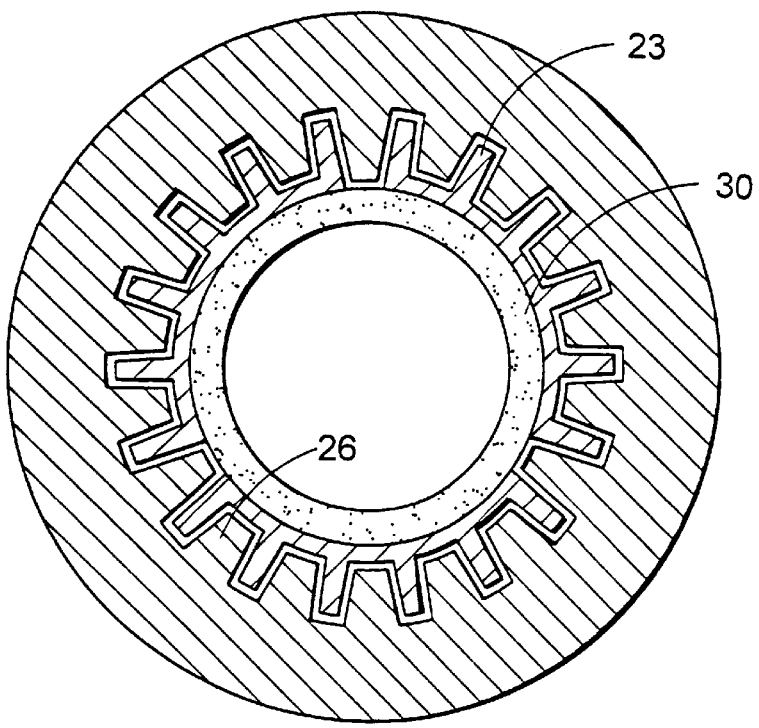
FIG. 8 is a sectional view showing the cross-section of the die used in Example 5 set forth hereinbelow to manufacture MEC components.

MBC components having aluminum fins joined to the circumference of ceramic pipes were produced by repeating the procedure of Example 3, except for the following points: a plurality of alumina pipes each having an outside diameter of 50 mm, a wall thickness of 5 mm and a length of 500 mm were provided as ceramic members; the die profile was changed from a rectangular to a circular shape; and the cross-section of the die 16B was changed from the shape shown in FIG. 5 to that shown in FIG. 8. In FIG. 8, 23 is a green score line (or breaking line) (also see FIG. 9 and FIG. 10A); 26 is a mold and 30 is an alumina tube.

Example 6

Figure 9:
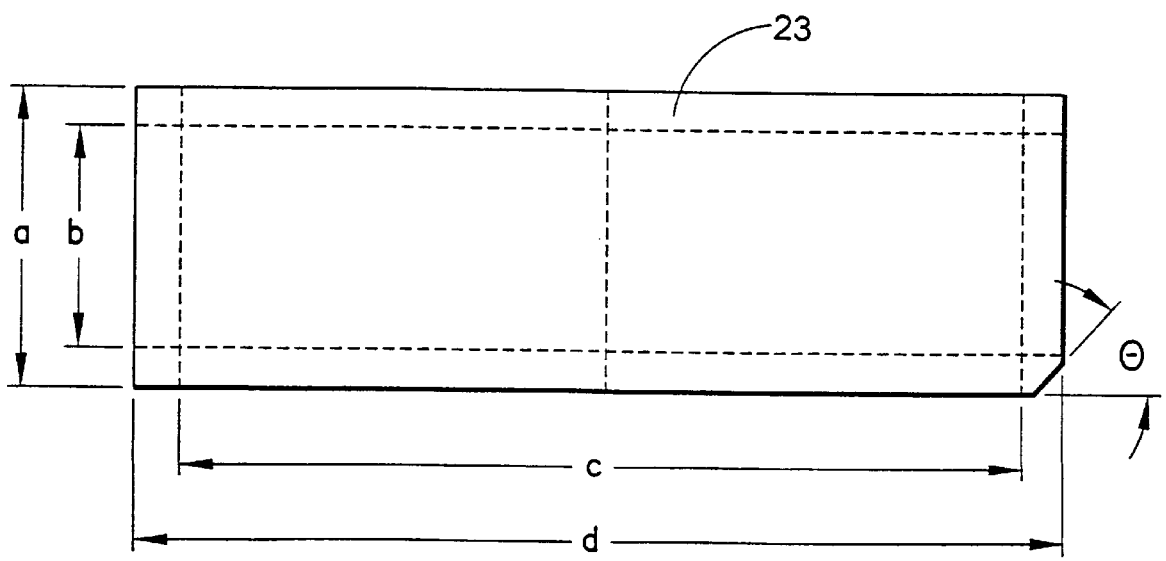
FIG. 9 is a plan view showing the dimensions of the ceramic substrates used in Examples 6 and 7 set forth hereinbelow, as well as the positions of the breaking lines, wherein a=36 mm, b=26 mm, c=102 mm, d=112 cm and $\Theta=45°$.

Aluminum-bonded-alumina plates were produced by repeating the procedure of Example 2, except that a plurality of alumina substrates 0.635 mm thick having breaking lines as shown in FIG. 9 were provided as ceramic substrates. Each MBC member was broken apart in the connecting portions and the surface of the metal portion was polished in preparation for resist formation.

Figure 10A:
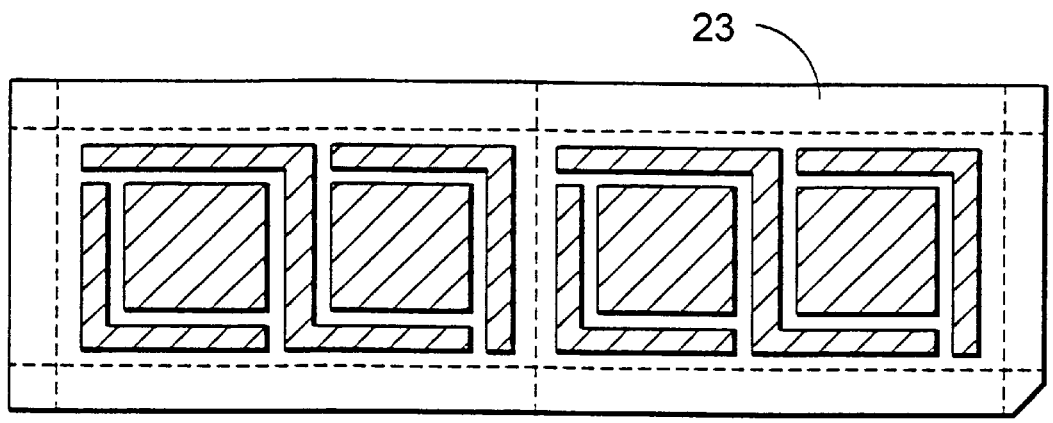
FIG. 10A and FIG. 10B are plan views showing the circuit patterns formed on one side and the base metal on the other side of the aluminum-bonded-ceramic substrate by etching method.
Figure 10B:
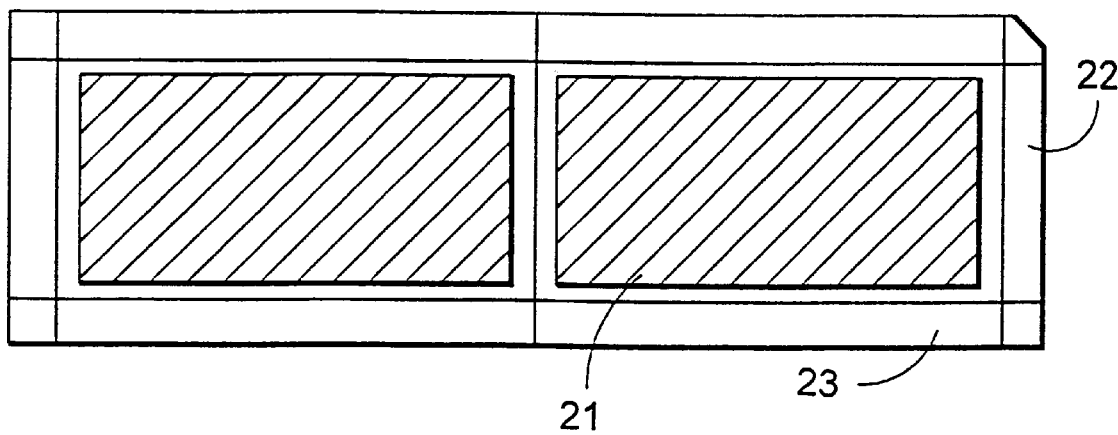

After resist formation the metal portion of each MBC substrate was sprayed with a liquid etchant in the form of an aqueous solution of a mixture of 35% 40 Be iron chloride and 10% HCl, whereby circuit patterns of the geometries shown in FIG. 10A and FIG. 10B were formed on opposite sides of MBC substrate. The surfaces of the circuit patterns were subjected to a treatment for zinc replacement and a nickel plate was deposited in a thickness of 3 to 5 $\mu$m. The thus fabricated composite substrate was split along the breaking lines to yield two aluminum-bonded-alumina electronic circuit substrates each having a width of 26 mm and a length of 51 mm. In FIG. 10B, 21 is aluminum and 22 is a ceramic substrate.

The MBC substrates were found to have the following characteristics:

Peel strength>30 kg/cm (aluminum broke)

Resistance to heat cycles>3,000 cycles (without cracking)
Bending strength=69 kg/mm²
Deflection=286 μm

Example 7

Aluminum-bonded-aluminum nitride directly joined substrates were produced by repeating the procedure of Example 2, except that the alumina substrates were replaced by aluminum nitride plates measuring 36 mm×52 mm×0.635 mm. The MBC substrates thus produced had the following characteristics:

Peel strength>20 kg/cm
Resistance to heat cycles>3,000 cycles
Bending strength=53 kg/mm²
Deflection=230 μm

Example 8

Aluminum-bonded-silicon nitride joined substrates were produced by repeating the procedure of Example 2, except that the alumina substrates were replaced by silicon nitride plates measuring 36 mm×52 mm×0.32 mm. The MBC substrates thus produced had the following characteristics:

Peel strength>20 kg/cm
Resistance to heat cycles>3,000 cycles
Bending strength=80 kg/mm²
Deflection=1.6 mm

What is claimed is:

1. A process for producing aluminum or an aluminum alloy-bonded-ceramic material or a component having aluminum or an aluminum alloy joined to at least a part of a ceramic member, comprising:

(a) contacting a ceramic member made of a ceramic with a melt of a metal selected from the group consisting of aluminum and an aluminum alloy at a temperature of not lower than the melting point of the metal, (b) moving said ceramic member as it is maintained in contact with the melt of said metal to create a relative movement between the melt of said metal and the ceramic member over a distance sufficient to produce a clean interface between the melt of said metal and the ceramic member so that said ceramic member is wetted by the melt, and (c) cooling the melt of said metal so that the melt of said metal solidifies on a surface of said ceramic member.

2. The process according to claim 1, wherein the ceramic is alumina.

3. The process according to claim 1, wherein the ceramic is aluminum nitride.

4. The process according to claim 1, wherein the ceramic is silicon nitride.

5. The process according to claim 1, wherein the ceramic member is aluminum nitride and the metal is an aluminum alloy.

6. The process according to claim 1, wherein the ceramic member is silicon nitride and the metal is aluminum.

7. The process according to claim 1, wherein the ceramic member is silicon nitride and the metal is an aluminum alloy.

8. The process according to claim 1, wherein said temperature is 700 to 900° C. and said distance is 8 mm or more.

9. The process according to claim 1, wherein the ceramic member comprises alumina and the metal comprises aluminum.

10. A process for producing aluminum or an aluminum alloy-bonded-ceramic material or a component having aluminum or an aluminum alloy joined to at least a part of a ceramic member, comprising:

(a) contacting a ceramic member made of a ceramic with a melt of a metal selected from the group consisting of aluminum and an aluminum alloy at a temperature of not lower than the melting point of the metal, (b) moving said ceramic member so that a portion of said ceramic member for joining to the metal is maintained in contact with the melt of said metal to create a relative movement between the melt of said metal and the ceramic member over a distance sufficient to produce clean interface between the melt of said metal and the ceramic member so that said portion of said ceramic material for joining to the metal is wetted by said melt of said metal, and (c) allowing said melt of said metal or a part thereof to solidify in an area of said ceramic member to form a shaped aluminum or aluminum alloy part.

11. A process for producing aluminum or an aluminum alloy-bonded-ceramic material or a component having aluminum or an aluminum alloy joined to at least a part of a ceramic member, comprising:

(a) continuously supplying a ceramic member to a melt of a metal selected from the group consisting of aluminum and an aluminum alloy at a temperature of not lower than the melting point of the metal, (b) moving said ceramic member so that a portion of said ceramic member for joining to the metal is maintained in contact with the melt of said metal to create a relative movement between the melt of said metal and the ceramic member over a distance sufficient to produce a clean interface between the melt of said metal and the ceramic member so that said portion of said ceramic material for joining to the metal is wetted by said melt of said metal, and (c) recovering said ceramic member so that a part of said melt of said metal solidifies in an area of the ceramic member to form a shaped aluminum or aluminum alloy part.

12. The process according to claim 11, wherein the ceramic member is aluminum nitride and the metal is an aluminum alloy.

13. The process according to claim 11, wherein the ceramic member is silicon nitride and the metal is aluminum.

14. The process according to claim 11, wherein the ceramic member is silicon nitride and the metal is an aluminum alloy.

15. The process according to claim 11, wherein said temperature is 700 to 900° C. and said distance is 8 mm or more.

16. The process according to claim 11, wherein the ceramic member comprises alumina and the metal comprises aluminum.

17. A process for producing aluminum or an aluminum alloy-bonded-ceramic material or a component having aluminum or an aluminum alloy joined to at least a part of a ceramic material, comprising:

(a) continuously feeding in an inlet portion of a die, a ceramic member made of a ceramic selected from the group consisting of alumina, aluminum nitride and silicon nitride into a melt of a metal selected from the group consisting of aluminum and an aluminum alloy at a temperature of not lower than the melting point of the metal, to produce a clean interface between the melt of said metal and the ceramic member to fully wet by said melt of said metal a portion of the ceramic material to be joined to said metal, and (b) passing the ceramic member through the die so that a part of said melt of said metal solidifies on a surface portion of said ceramic member which exits through an outlet portion of the die, to form a shaped aluminum or an aluminum alloy part.

18. The process according to claim 17, wherein the ceramic member is aluminum nitride and the metal is an aluminum alloy.

19. The process according to claim 17, wherein the ceramic member is silicon nitride and the metal is aluminum.

20. The process according to claim 17, wherein the ceramic member is silicon nitride and the metal is an aluminum alloy.

21. The process according to claim 17, wherein said temperature is 700 to 900° C.

22. The process according to claim 17, wherein the ceramic member comprises alumina and the metal comprises aluminum.

* * * * *